United States Patent [19]

Hirano et al.

[11] Patent Number: 5,760,606
[45] Date of Patent: Jun. 2, 1998

[54] HIGH VOLTAGE WITHSTANDING CIRCUIT AND VOLTAGE LEVEL SHIFTER

[75] Inventors: Hiroshige Hirano, Nara; Shigeo Chaya, Shiga; Toshiyuki Honda, Nara, all of Japan

[73] Assignee: Matsushita Electric Industrial, Co., Osaka, Japan

[21] Appl. No.: 633,683

[22] Filed: Apr. 17, 1996

[30] Foreign Application Priority Data

Apr. 17, 1995 [JP] Japan ................... 7-091087

[51] Int. Cl.[6] .................................. H03K 19/0185
[52] U.S. Cl. ............................... 326/81; 326/87
[58] Field of Search ................... 326/80, 81, 82, 326/83, 86, 87

[56] References Cited

U.S. PATENT DOCUMENTS 4,217,502  8/1980  Suzuki et al. ................... 326/87
5,576,641  11/1996  Yoneya et al. ................... 326/87

FOREIGN PATENT DOCUMENTS 5-29891  8/1993  Japan.

Primary Examiner—Edward P. Westin
Assistant Examiner—Benjamin D. Driscoll
Attorney, Agent, or Firm—McDermott, Will & Emery

[57] ABSTRACT

A switch circuit having a high withstanding voltage and low driving ability and another switch circuit having a low withstanding voltage and high driving ability are connected to a specified node in parallel. When discharging the charges of the specified node, the switch circuit having the high withstanding voltage is turned ON and the switch circuit having the great driving ability is then turned ON. Accordingly, it is sufficient that only the transition of the logical voltage of a switch circuit having the high withstanding voltage is taken into consideration to set the ON timing of a switch circuit having the high driving ability. Consequently, timing setting can be performed easily. After the switch circuit having the high driving ability is turned ON, a discharge path for the charges of the specified node takes two paths which passes through both switch circuits in parallel. Consequently, an operating speed can be increased.

22 Claims, 15 Drawing Sheets

ON-STATE WITHSTANDING VOLTAGE

HIGH VOLTAGE WITHSTANDING CIRCUIT AND VOLTAGE LEVEL SHIFTER

BACKGROUND OF THE INVENTION

The present invention relates to the improvement of a high voltage withstanding circuit having a high voltage source and to a voltage level shifter using the high voltage withstanding circuit.

In general, it is required that a high voltage withstanding circuit having a high voltage source can operate well without breakdown caused by a high voltage. An N channel MOS transistor has the characteristics shown in FIG. 23. In the figure, when a gate voltage Vgn is 0 V, an OFF-state withstanding voltage (which is obtained during OFF operation) is 15 V or more. When the gate voltage Vgn exceeds 0 V, an ON-state withstanding voltage (which is obtained during ON operation) is reduced to about 9 V. A P channel MOS transistor has the characteristics shown in FIG. 24. In the figure, when a gate voltage Vgp is 15 V, the OFF-state withstanding voltage is 15 V or more. When the gate voltage Vgp is less than 15 V, the ON-state withstanding voltage is 15 V or more. Referring to the high voltage withstanding circuit having N and P channel MOS transistors, a hot carrier is generated if a high voltage (for example, 12 V) is continuously applied to the source and drain of the N channel MOS transistor for a long time when turning ON the N channel MOS transistor. Consequently, the N channel MOS transistor is sometimes broken down.

Japanese Laid-Open Patent No. 5-259891 and the like have disclosed a high voltage withstanding circuit which prevents the breakdown of the N channel MOS transistor. Such a high voltage withstanding circuit generally controls a current which flows to transistors which compose an inverter to be a clocked inverter, thereby a hot carrier can be prevented to obtain a high withstanding voltage, which will be described below.

FIG. 21 shows a high voltage withstanding circuit composing the clocked inverter according to the prior art. In FIG. 21, VPP designates a high voltage source and VSS designates a ground voltage source. P channel MOS transistors Qp211 and Qp212 and N channel MOS transistors Qn211 and Qn212 are provided in series between the voltage sources VPP and VSS.

N211 designates an output node for connecting the P channel MOS transistor Qp212 and the N channel MOS transistor Qn212. N212 designates a node for connecting the P channel MOS transistors Qp211 and Qp212. N213 designates a node for connecting the N channel MOS transistors Qn211 and Qn212. A control signal C211 is input to the gates of the P and N channel MOS transistors Qp211 and Qn211. A control signal C212 is input to the gate of the P channel MOS transistor Qp212. A control signal C213 is input to the gate of the N channel MOS transistor Qn212.

The operation of the high voltage withstanding circuit according to the prior art will be described below with reference to a timing chart shown in FIG. 22.

At first, the control signals C211, C212 and C213 have logical voltages "L", "L" and "H". The nodes N211 to N213 have the logical voltage "H"(a high voltage Vh of the high voltage source VPP). At a time t20, the control signals C212 and C213 are set to have the logical voltages "H" and "L". The P and N channel MOS transistors Qp212 and Qn212 are turned OFF so that the output node N211 is floated.

Subsequently, when the control signal C211 is set to have the logical voltage "H" at a time t21, the N channel MOS transistor Qn211 is turned ON so that the node N213 starts the transition of the logical voltage from "H" to "L". Then, at the stage where a drop in voltage of the node N213 is advanced to some extent, for example, at a time t22 when the voltage of the node N213 is dropped to the voltage which is half of the high voltage Vh, the control signals C212 and C213 are set to have the logical voltages "L" and "H". Consequently, the N channel MOS transistor Qn212 is turned ON so that the output node N211 is connected to the ground voltage source VSS. As a result, the voltage of the output node N211 starts the transition from "H" to "L". At this time, the difference between the voltage of the output node N211 and that of the node N213, that is, half of the high voltage Vh is applied to the N channel MOS transistor Qn212, and the difference between the voltage of the node N213 and the ground voltage of the ground voltage source VSS, that is, half of the high voltage Vh is applied to the N channel MOS transistor Qn211. Consequently, a current which flows to the N channel MOS transistors Qn211 and Qn212 is limited so that the transistors Qn211 and Qn212 become hard to break down.

In the high voltage withstanding circuit according to the prior art described above, however, the N channel MOS transistors Qn211 and Qn212 are connected in series. Accordingly, it is necessary to consider the transition of the logical voltage of the N channel MOS transistor Qn 211 from "H" to "L" and that of the logical voltage of the N channel MOS transistor Qn212 from "H" to "L" so as to set the time t22. For this reason, it is hard to set the clock timing of the time t22. As a result, if the time t22 is not set properly, the N channel MOS transistors Qn211 and Qn212 are broken down.

Since the N channel MOS transistors Qn211 and Qn212 are connected in series, the driving ability is small and an operating speed is low.

In particular, if the capacity of the output node N211 is great, it is much harder to set the timing of the time t22 and the operating speed is decreased still more.

SUMMARY OF THE INVENTION

It is an object of the present invention to provide a high voltage withstanding circuit in which a clock timing can be set easily and an operating speed can be increased.

In order to accomplish the above object, two MOS transistors are connected to a specified node in parallel so that it is not necessary to consider their transitions of logical voltages thereof from "H" to "L" together. Consequently, the clock timing can be set easily and the operating speed can be increased by using, as two paths, a discharge path for charges in the transition from "H" to "L".

More specifically, the present invention provides a high voltage withstanding circuit which operates by using a high voltage source as a voltage source, comprising a first switch circuit connected between the high voltage source and a specified node, and second and third switch circuits connected between the specified node and a ground voltage source, wherein the third switch circuit has a higher withstanding voltage in the ON state than that of the second switch circuit, and wherein when the specified node has the high voltage of the high voltage source, the charges stored in the specified node are discharged through the third switch circuit at the beginning of the discharge of the charges.

The present invention is characterized in that the third switch circuit having the high withstanding voltage is formed by a plurality of MOS transistors having a great gate length or small gate width which are connected in parallel.

Furthermore, the present invention provides a voltage level shifter which inputs an external signal that is changed to have a predetermined voltage and a ground voltage, and outputs a signal having the ground voltage when the input signal has the predetermined voltage and outputs a signal having a higher voltage than the predetermined voltage when the input signal has the ground voltage, comprising a high voltage source for generating the higher voltage, a first switch circuit connected between the high voltage source and an output node, and second and third switch circuits connected between the output node and a ground voltage source, wherein the third switch circuit has a higher withstanding voltage in the ON state than that of the second switch circuit, wherein the first switch circuit is turned ON to connect the high voltage source to the output node when the external signal has the ground voltage, and wherein the third switch circuit is turned ON when the external signal has the transition from the ground voltage to the predetermined voltage, and the second switch circuit is turned ON to connect the output node to the ground voltage source when a set period passes since said third switch circuit is turned ON.

According to the above structure of the present invention, the third switch circuit having the high withstanding voltage is first turned ON when changing the logical voltage of the specified node from "H" to "L". Consequently, the specified node is connected to the ground voltage source so that the voltage of the specified node is dropped. Then, the second switch circuit is turned ON when a preset time passes. Accordingly, it is sufficient that only the transition of the logical voltage of the third switch circuit from "H" to "L" is taken into consideration to set the ON timing of the second switch circuit. Thus, timing setting can be performed easily. After the second switch circuit is turned ON, a discharge path for the charges of the specified node takes two paths which passes through the second and third switch circuits in parallel. Consequently, the operating speed can be increased.

The above object and novel characteristics of the present invention will be more completely apparent from the following detailed description and the accompanying drawings.

BRIEF DESCRIPTION OF THE DRAWINGS

The accompanying drawings show the preferred embodiments of the present invention in which.

DETAILED DESCRIPTION OF THE INVENTION

Preferred embodiments of the present invention will be described below with reference to the drawings.
(First Embodiment of the Present Invention)

Figure 1:
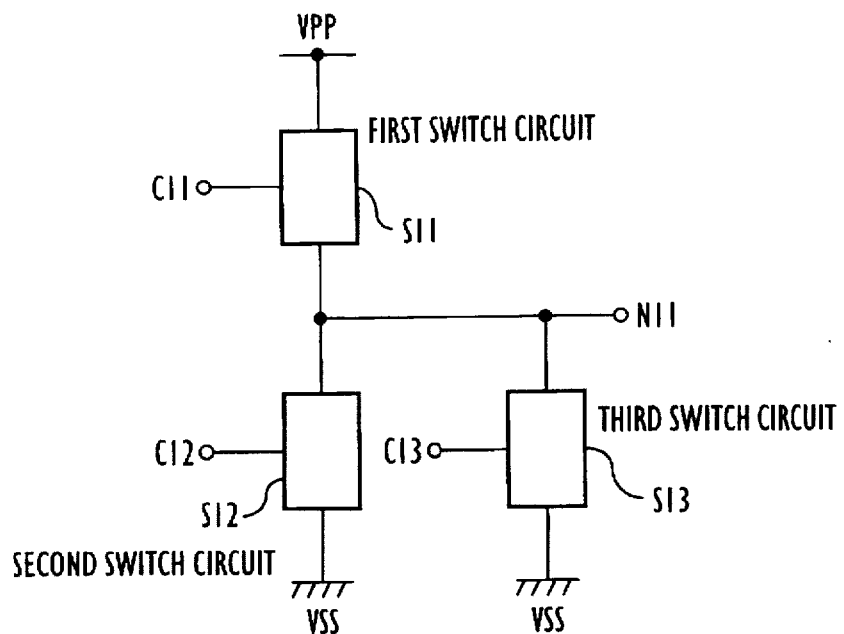
FIG. 1 is a block diagram showing the structure of a high voltage withstanding circuit according to a first embodiment of the present invention.

FIG. 1 is a block diagram showing a high voltage withstanding circuit according to a first embodiment of the present invention. In FIG. 1, VPP designates a high voltage source for generating a predetermined high voltage (for example, 12 V), VSS designates a ground voltage source, S11 to S13 designate first to third switch circuits, and N11 designates an output node (a specified node). The first switch circuit S11 is provided between the high voltage source VPP and the output node N11, and is turned ON on receipt of a control signal C11. The second switch circuit S12 is provided between the output node N11 and the ground voltage source VSS. The third switch circuit S13 is provided in parallel with the second switch circuit S12.

The second switch circuit S12 has a low withstanding voltage and great driving ability, and is turned ON on receipt of a control signal C12. The third switch circuit S13 has a high withstanding voltage and small driving ability, and is turned ON on receipt of a control signal C13.

Figure 2:
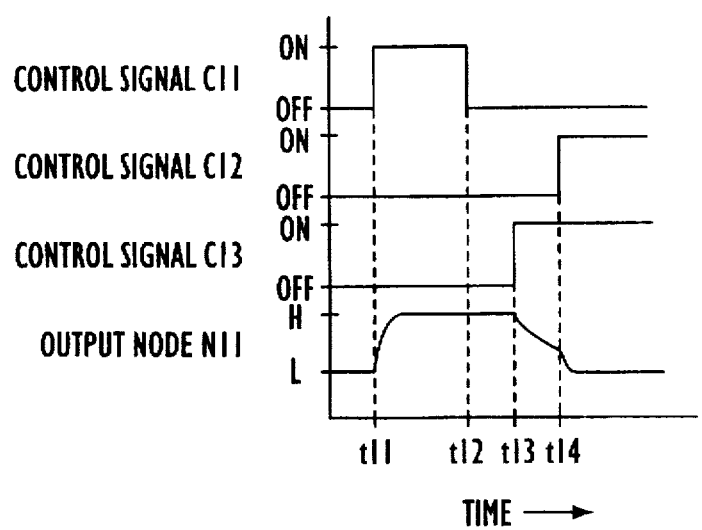
FIG. 2 is a timing chart showing the operation of the high voltage withstanding circuit according to the first embodiment of the present invention.

The operation of the high voltage withstanding circuit shown in FIG. 1 will be described below with reference to the timing chart of FIG. 2.

At first, the control signals C11, C12 and C13 are not output at all. Accordingly, all the switch circuits S11 to S13 are turned OFF and the output node N11 has a logical voltage "L".

When the control signal C11 is output at a time t11, the first switch circuit S11 is turned ON so that the high voltage source VPP is connected to the output node N11. Accordingly, the output node N11 is set to have a logical voltage "H".

Then, the output of the control signal C11 is stopped at a time t12. Consequently, the first switch circuit S11 is turned OFF so that the output node N11 is floated with the logical voltage "H" kept.

When the control signal C13 is output at a time t13, the third switch circuit S13 having a high withstanding voltage is turned ON. Consequently, the output node N11 is connected to the ground voltage source VSS so that it starts the transition of the logical voltage from "H" to "L".

At a time t14 when the voltage of the output node N11 is dropped to a value which is less than the intermediate potential between the logical voltages "H" and "L", the control signal C12 is output. As a result, the second switch circuit S12 having the great driving ability is turned ON so that the output node N11 is connected to the ground voltage source VSS through the second switch circuit S12. In this state, the voltage of the output node N11 reaches the logical voltage "L".

It is sufficient that only the transition of the third switch circuit S13 from ON to OFF (the transition of the logical voltage from "H" to "L") is taken into consideration to set the timing of the ON operation of the second switch circuit S12, that is, the time t14 when the control signal C12 is output. Consequently, the timing can be set easily.

In addition, after the second switch circuit S12 is turned ON, the output node N11 is connected to the ground voltage source VSS through the third switch circuit S13 having the small driving ability and the second switch circuit S12 having the great driving ability. Consequently, a speed at which charges are discharged is increased so that the voltage of the output node N11 is changed from the intermediate voltage to the logical voltage "L" at a high speed.

(First Specific Example of First Embodiment)

Figure 3:
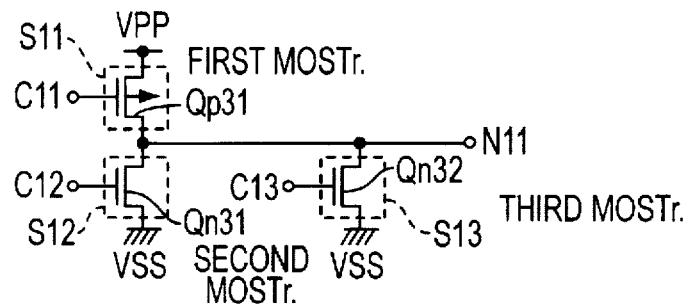
FIG. 3 is a diagram showing a first specific circuit according to the first embodiment of the present invention.

FIG. 3 shows a first specific circuit according to the first embodiment of the present invention.

In FIG. 3, a first switch circuit S11 is formed by a P channel MOS transistor (first MOS transistor) Qp31. The P channel MOS transistor Qp31 has a source connected to a high voltage source VPP, a drain connected to an output node N11, and a gate to which a control signal C11 is input.

A second switch circuit S12 is formed by an N channel MOS transistor (second MOS transistor) Qn31. The N channel MOS transistor Qn31 has a source connected to a ground voltage source VSS, a drain connected to the output node N11, and a gate to which a control signal C12 is input. A third switch circuit S13 is formed by an N channel MOS transistor (third MOS transistor) Qn32. The N channel MOS transistor Qn32 has a source connected to the ground voltage source VSS, a drain connected to the output node N11, and a gate to which a control signal C13 is input.

The N channel MOS transistor (second MOS transistor) Qn31 has a low withstanding voltage and great driving ability. The N channel MOS transistor (third MOS transistor) Qn32 has a high withstanding voltage and small driving ability.

Figure 4:
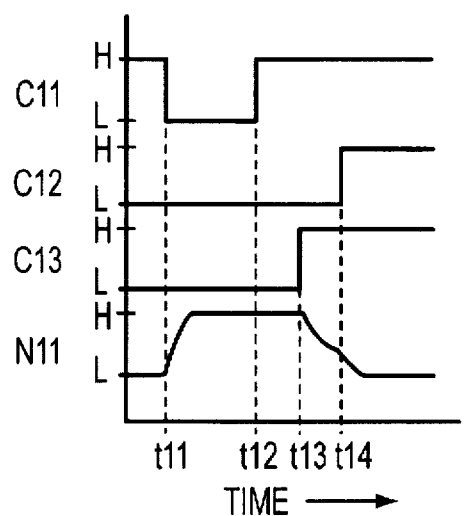
FIG. 4 is a timing chart showing the operation of the first specific circuit according to the first embodiment of the present invention.

Accordingly, the specific circuit according to the present example operates as shown in the timing chart of FIG. 4. More specifically, when the control signal C11 is output at a time t11 (that is, "H"(the voltage of the high voltage source VPP) is changed to "L"(the voltage of the ground voltage source VSS)), the P channel MOS transistor Qp31 is turned ON so that the output node N11 is set to have a logical voltage "H". Then, the output of the control signal C11 is stopped at a time t12 to turn OFF the P channel MOS transistor Qp31 so that the output node N11 is floated. Thereafter, when the control signal C13 is output (that is, the transition from "L" to "H") at a time t13, the N channel MOS transistor Qn32 having the high withstanding voltage is turned ON so that the output node N11 starts the transition of the logical voltage from "H" to "L". When the control signal C12 is output (that is, the transition from "L" to "H") at a time t14, the N channel MOS transistor Qn32 having the great driving ability is also turned ON so that the output node N11 is set to have the logical voltage "L" at a high speed.

The specific circuit according to the present example has a high withstanding voltage (15 V) surely. Furthermore, a speed at which the logical voltage of the output node N11 is changed from "H" to "L" is increased by about 50% or more as compared with the prior art.

(Second Specific Example of First Embodiment)

Figure 5:
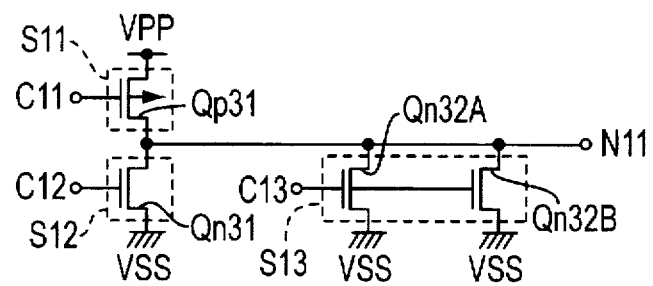
FIG. 5 is a diagram showing a second specific circuit according to the first embodiment of the present invention.

FIG. 5 shows a second specific circuit according to the first embodiment of the present invention.

In FIG. 5, a third switch circuit S13 comprises N channel MOS transistors Qn32A and Qn32B which are connected in parallel with each other. The N channel MOS transistors Qn32A and Qn32B are turned ON on receipt of a control signal C13. In addition, the N channel MOS transistors Qn32A and Qn32B have great gate lengths L and small gate widths W.

Since other structures are the same as the structure of the first specific circuit described above, the same reference numbers designate the same portions whose description will be omitted. Since the operation of the specific circuit according to the present example is the same as that of the first specific circuit shown in FIG. 4, its description will also be omitted.

Figure 6:
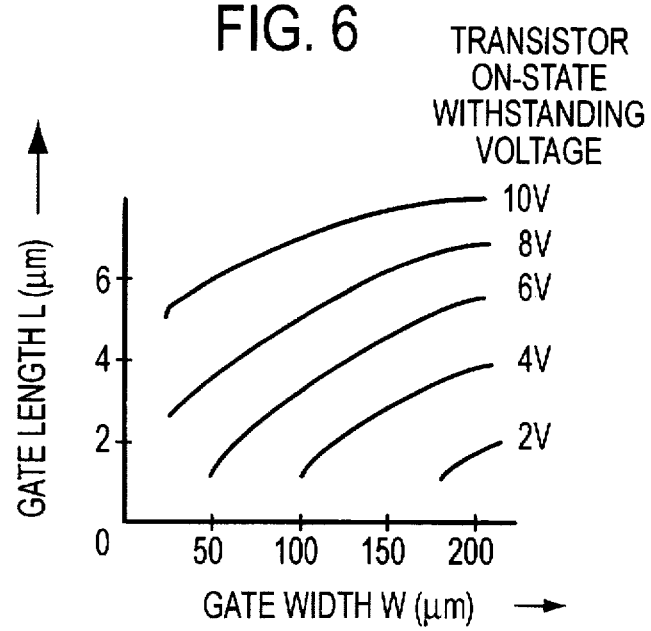
FIG. 6 is a diagram showing the relationship between the gate length and width of a transistor and the ON-state withstanding voltage thereof.

FIG. 6 shows the ON-state withstanding voltage characteristic curve of the N channel MOS transistor. As seen from FIG. 6, as the gate length L is increased or the gate width W is decreased, the ON-state withstanding voltage of the N channel MOS transistor becomes higher. If a plurality of N channel MOS transistors having a great gate length L and a small gate width W are connected in parallel as in the specific circuit of the present example, the ON-state withstanding voltages thereof can be increased. Thus, the ON-state withstanding voltage is increased because a hot carrier can be prevented from occurring in a transistor portion.

If an N channel MOS transistor having a gate length L of 1 μm and a gate width W of 100 μm is used, the ON-state withstanding voltage is 4 V. If 20 N channel MOS transistors having a gate length L of 5 μm and a gate width W of 25 μm are connected in parallel, the ON-state withstanding voltages of the N channel MOS transistors are increased to 10 V without deteriorating the driving ability thereof.

It is the most preferable that the N channel MOS transistors Qn32A and Qn32B have great gate lengths L and small gate widths W. However, even if the N channel MOS transistors having either the great gate lengths L or the small gate widths W are used, the same effects can be obtained. Furthermore, also in the case where a plurality of N channel MOS transistors having the small gate length L are connected in series, the same effects can be obtained.

According to the present example, a high voltage withstanding circuit having more reliability than that of the first specific circuit described above can be formed without increasing the layout area.

(Third Specific Example of First Embodiment)

A third specific circuit according to the first embodiment of the present invention will be described below.

The structure of the specific circuit according to the present example adopts that of the first or second specific circuit described above except for the voltage value of a control signal.

Figure 7:
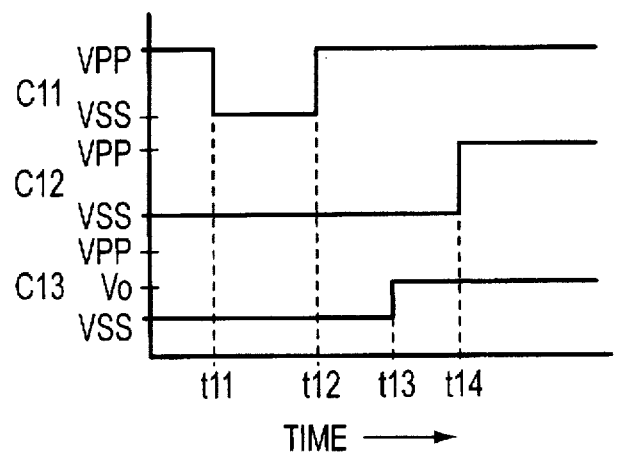
FIG. 7 is a timing chart showing the operation of a third specific circuit according to the first embodiment of the present invention.

FIG. 7 is a timing chart showing the specific circuit according to the present example. In FIG. 7, control signals C11 and C12 are controlled so as to have the voltages of a high voltage source VPP and a ground voltage source VSS. A control signal C13 is controlled so as to have a predetermined voltage V0 which is lower than the voltage of the high voltage source VPP, and the voltage of the ground voltage source VSS.

According to the specific circuit of the present example, the control signal C13 is changed from the voltage of the ground voltage source VSS to the predetermined voltage V0 which is lower than the voltage of the high voltage source VPP at a time t13 as shown in FIG. 7. At this time, the gate voltage of an N channel MOS transistor Qn32 (or Qn32A and Qn32B) is low, that is, equal to the predetermined voltage V0 so that a hot carrier can be prevented from occurring. Accordingly, the N channel MOS transistor Qn32 (or Qn32A and Qn32B) is hard to break down. Thus, a high voltage withstanding circuit having much better reliability can be formed.

(Fourth Specific Example of First Embodiment)

Figure 8:
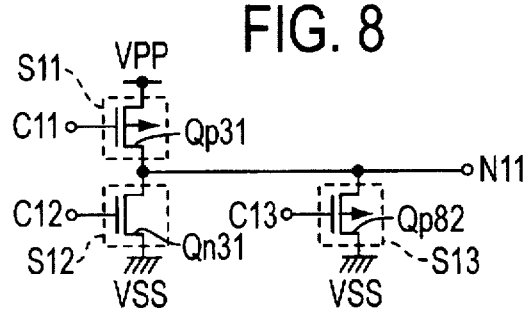
FIG. 8 is a diagram showing a fourth specific circuit according to the first embodiment of the present invention.

FIG. 8 shows a fourth specific circuit according to the first embodiment of the present invention.

Figure 9:
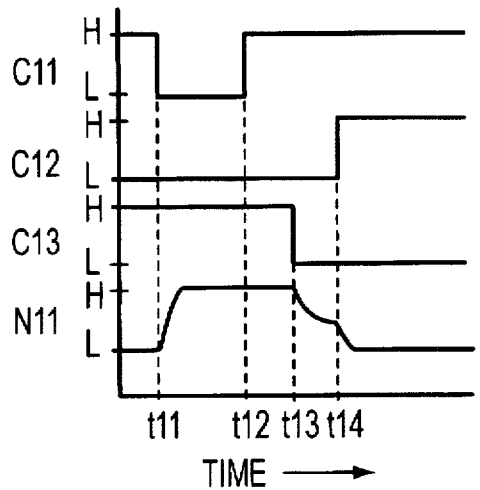
FIG. 9 is a timing chart showing the operation of the fourth specific circuit according to the first embodiment of the present invention.

The specific circuit shown in FIG. 8 differs from the first specific circuit shown in FIG. 3 in that a third switch circuit S13 has a different structure. In other words, the third switch circuit S13 is formed by the N channel MOS transistor Qn32 in FIG. 3, while the third switch circuit S13 of the present example is formed by a P channel MOS transistor Qp82. According to the specific circuit of the present example, a control signal C13 which is input to the gate of the P channel MOS transistor Qp82 is output (changed from "H" to "L") at a time t13 as shown in the timing chart of FIG. 9.

Figure 23:
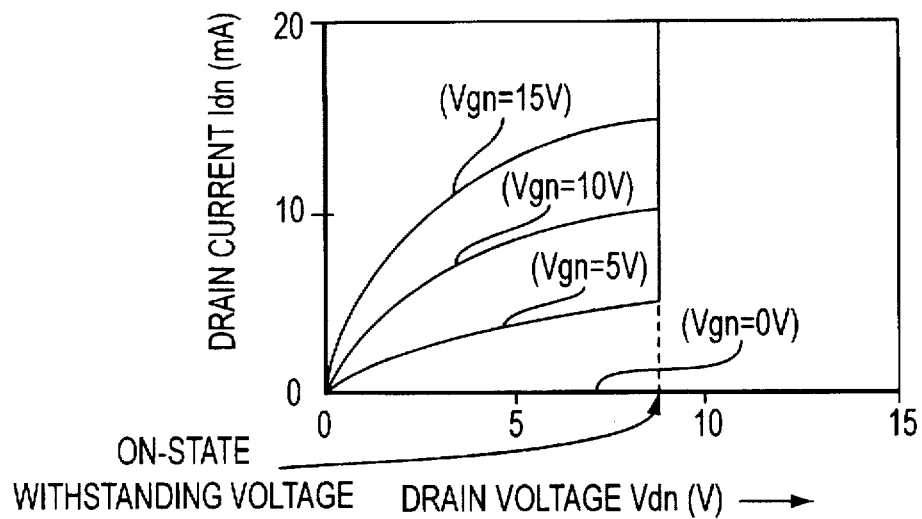
FIG. 23 is a diagram showing the ON-state withstanding voltage characteristics of an N channel MOS transistor used for the high voltage withstanding circuit.
Figure 24:
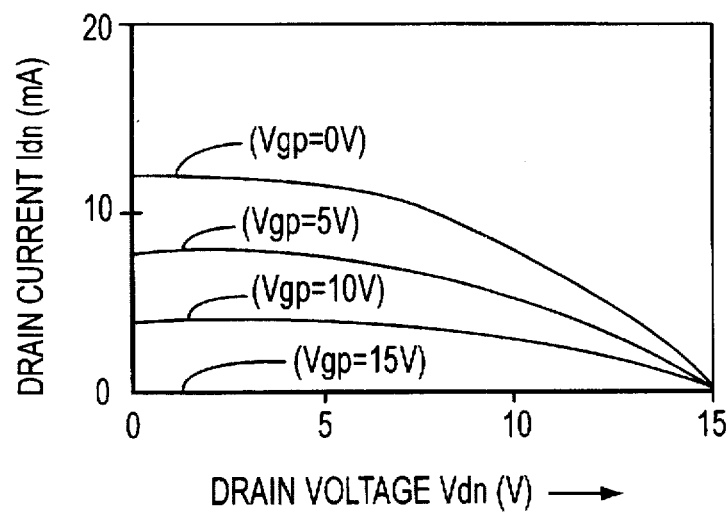
FIG. 24 is a diagram showing the ON-state withstanding voltage characteristics of a P channel MOS transistor used for the high voltage withstanding circuit.

As seen from the characteristic charts of a transistor shown in FIGS. 23 and 24, generally, the ON-state withstanding voltage of the P channel MOS transistor is higher than that of the N channel MOS transistor. According to the specific circuit of the present example, when discharging the charges of an output node N11, the charges are discharged by the P channel MOS transistor Qp82 having a high withstanding voltage and then by the N channel MOS transistor Qn31 having great driving ability at a high speed.

According to the specific circuit of the present example, if the gate voltage of the P channel MOS transistor Qp82 is 0 V, the charges cannot be discharged completely. Consequently, the charges are completely discharged by the N channel MOS transistor Qn31 which is connected to the P channel MOS transistor Qp82 in parallel.

(Second Embodiment of the Present Invention)

Figure 10:
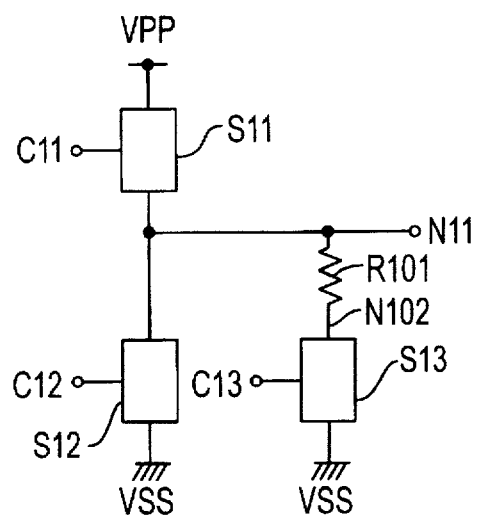
FIG. 10 is a block diagram showing the structure of a high voltage withstanding circuit according to a second embodiment of the present invention.

FIG. 10 is a block circuit diagram showing a second embodiment of the present invention.

A high voltage withstanding circuit shown in FIG. 10 is formed by adding a resistor R101 to the high voltage withstanding circuit according to the first embodiment shown in FIG. 1. The resistor R101 is provided between an output node N11 and the output node N 11 side (that is, a node N102 shown in FIG. 10) of a third switch circuit S13.

Figure 11:
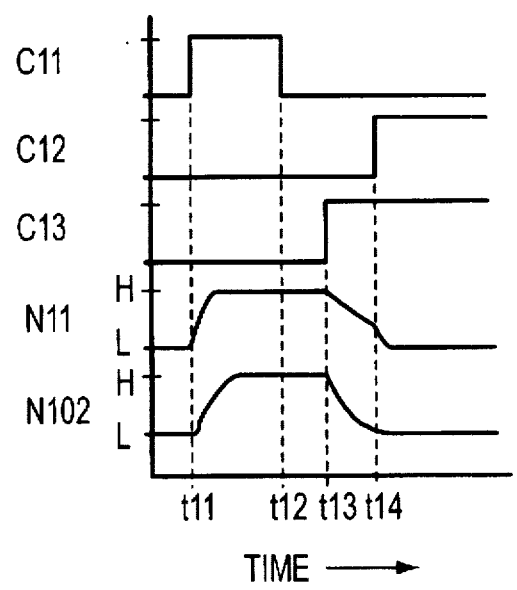
FIG. 11 is a timing chart showing the operation of the high voltage withstanding circuit according to the second embodiment of the present invention.

The operation of the high voltage withstanding circuit according to the present embodiment is the same as that of the high voltage withstanding circuit according to the first embodiment. As seen from the timing chart of FIG. 11, the time for which a high voltage is applied to the third switch circuit S13 is reduced because the resistor R101 is provided. The time for which the high voltage is applied is determined by the capacity of the output node N11 and the value of the resistor R101. Accordingly, as the time for which the high voltage is applied to the third switch circuit S13 is reduced, a hot carrier can be prevented from occurring more effectively. Consequently, higher voltage withstanding properties can be obtained as compared with the high voltage withstanding circuit according to the first embodiment described above.

(Specific Example of Second Embodiment of the Present Invention)

Figure 12:
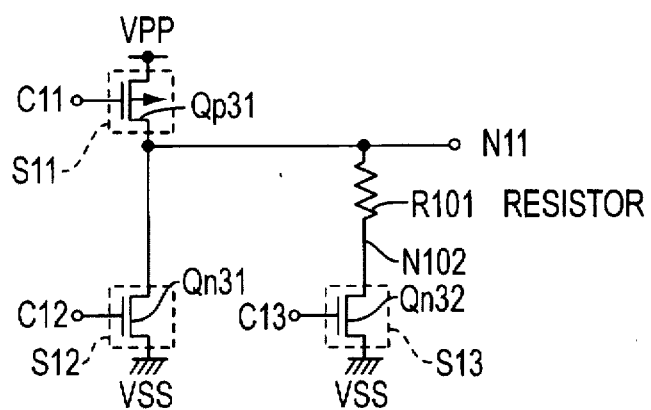
FIG. 12 is a diagram showing a specific high voltage withstanding circuit according to the second embodiment of the present invention.

FIG. 12 shows a specific circuit according to the second embodiment of the present invention.

Figure 13:
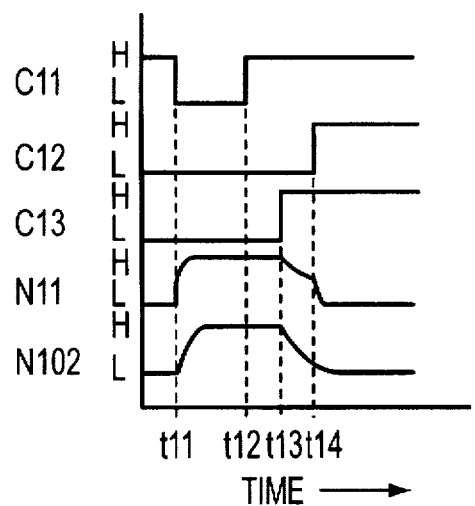
FIG. 13 is a timing chart showing the operation of the specific high voltage withstanding circuit according to the second embodiment of the present invention.

The specific circuit of the present example is formed by adding a resistor 101 to the structure of the first specific circuit according to the first embodiment shown in FIG. 3. FIG. 13 shows the operating timing of the specific circuit of the present example.

The high voltage withstanding circuit according to the second embodiment is not restricted to the specific circuit of the present example but can be formed by the structure of the second specific circuit according to the first embodiment shown in FIG. 5, the timing of the control signal of the third specific circuit shown in FIG. 7, and the structure of the fourth specific circuit shown in FIG. 8.

(Third Embodiment of the Present Invention)

Figure 14:
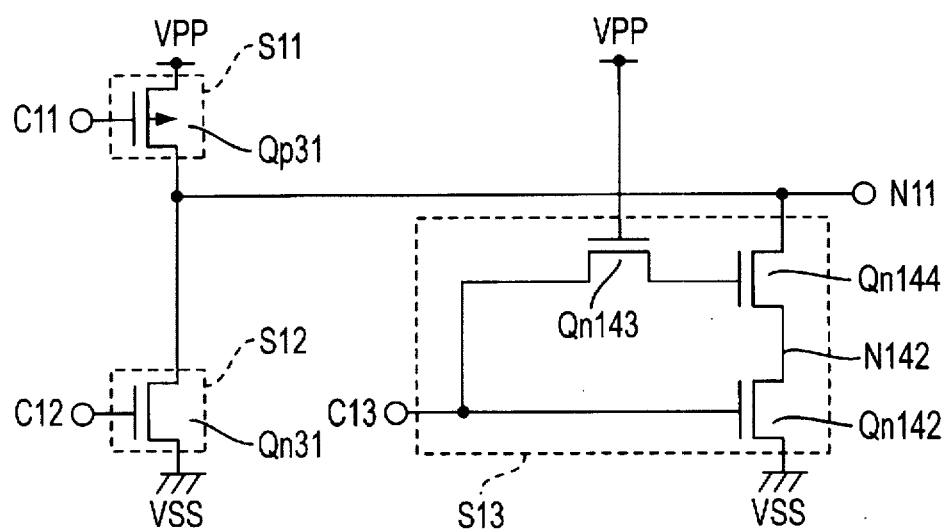
FIG. 14 is a diagram showing a high voltage withstanding circuit according to a third embodiment of the present invention.

FIG. 14 is a circuit diagram according to a third embodiment of the present invention.

According to the present embodiment, the structure of a third switch circuit S13 is changed. More specifically, the third switch circuit S13 comprises N channel MOS transistors Qn142, Qn143 and Qn144. The first and second N channel MOS transistors Qn144 and Qn142 are connected on a node N142 in series. The drain of the first N channel MOS transistor Qn144 which is provided on the upper side in FIG. 14 is connected to an output node N11. The second N channel MOS transistor Qn142 provided on the lower side in FIG. 14 has a source connected to a ground voltage source VSS and a gate to which a control signal C13 is input. The third N channel MOS transistor Qn143 has a source to which the control signal C13 is input, a drain connected to the gate of the first N channel MOS transistor Qn144, and a gate connected to a high voltage source VPP.

Figure 15:
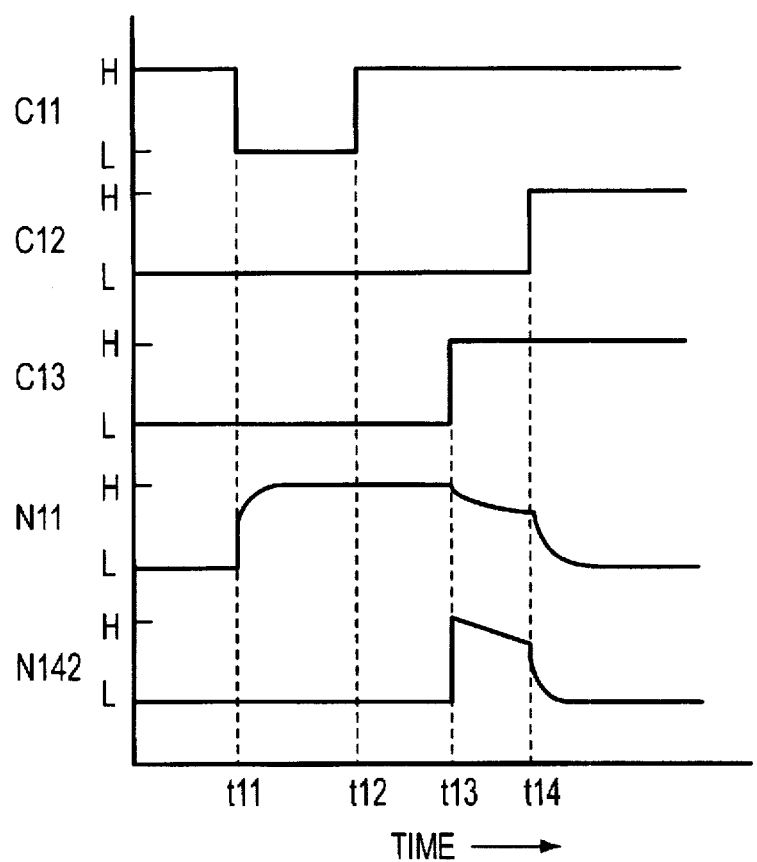
FIG. 15 is a timing chart showing the operation of the high voltage withstanding circuit according to the third embodiment of the present invention.

According to the present embodiment, when the control signal C13 is output, (that is, a logical voltage (the voltage of a high voltage source VPP) is changed from "L" to "H") at a time t13 as shown in the timing chart of FIG. 15, the control signal C13 is input to the gate of the first N channel MOS transistor Qn144 and a voltage which is lower than that of the control signal C13 by the threshold voltage of the third N channel MOS transistor Qn143 is input to the gate of the second N channel MOS transistor Qn142. As a result, the first and second transistors Qn144 and Qn142 are turned ON so that the charges of the output node N11 are discharged to the ground voltage source VSS. Consequently, the voltage of the output node N11 is changed from "H" to "L". During this transition, it is hard for a current to flow to the first N channel MOS transistor Qn144. Accordingly, the first and second transistors Qn144 and Qn142 are hard to break down.

(Fourth Embodiment of the Present Invention)

Figure 16:
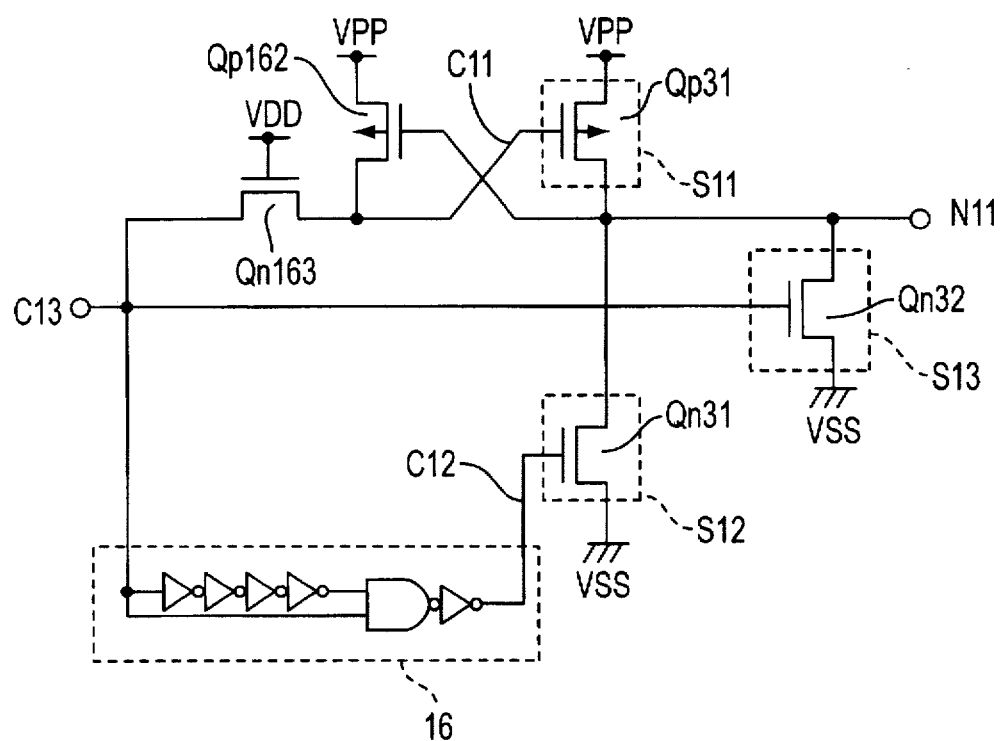
FIG. 16 is a diagram showing a voltage level shifter according to a fourth embodiment of the present invention.

FIG. 16 is a circuit diagram showing a fourth embodiment of the present invention. The present embodiment provides a voltage level shifter using a high voltage withstanding circuit according to the present invention.

In FIG. 16, first, second and third switch circuits S11, S12 and S13 have the same structures as that of the first specific circuit according to the first embodiment shown in FIG. 3.

Other structures will be described below. A control signal (external signal) C13 is changed to have logical voltages "H" and "L". The logical voltage "H" is a predetermined voltage having a normal value within a range, for example, between 3.3 V and 5 V. The control signal C13 is input to the gate of an N channel MOS transistor (third switch circuit) Qn32, and passes through an N channel MOS transistor Qn163 and is changed to a control signal C11 whose voltage is dropped by the threshold voltage of the N channel MOS transistor Qn163. The control signal C11 is input to the gate of a P channel MOS transistor (first switch circuit) Qp31. A voltage source VDD having the same voltage as the logical voltage "H" of the control signal C13 is connected to the gate of the N channel MOS transistor (another N channel MOS transistor) Qn163.

The reference numeral 16 designates a signal delay circuit. The signal delay circuit 16 delays the control signal C13 by a set time. The delayed signal is input as a control signal C12 to the gate of an N channel MOS transistor (second switch circuit) Qn31.

Qp162 designates a P channel MOS transistor having a gate connected to an output node N11, a source connected to a high voltage source VPP, and a drain connected to the gate of the P channel MOS transistor (first switch circuit) Qp31. Accordingly, the P channel MOS transistor Qp162 is turned ON when the voltage of the output node N11 is changed from "H" to "L". Consequently, the high voltage (for example, 12 V) of the high voltage source VPP is applied to the gate of the P channel MOS transistor (first switch circuit) Qp31 to be completely turned OFF.

Figure 17:
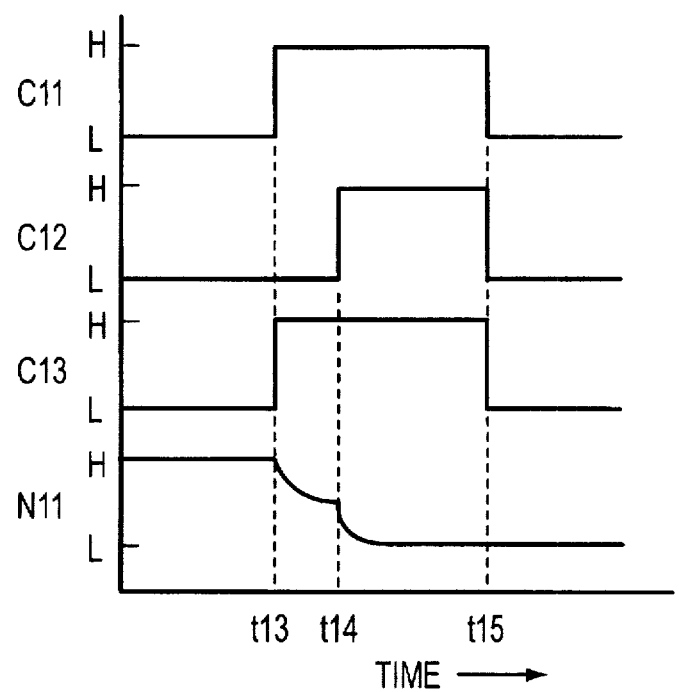
FIG. 17 is a timing chart showing the operation of the voltage level shifter according to the fourth embodiment of the present invention.

Accordingly, the voltage level shifter of the present embodiment operates as follows. At first, the control signals C11, C12 and C13 have the logical voltage "L" and the output node N11 has the logical voltage "H" as shown in the timing chart of FIG. 17.

Then, when the control signal C13 is set to have the logical voltage "H" at a time t13, an N channel MOS transistor (third switch circuit) Qn32 having a high withstanding voltage is turned ON so that the output node N11 is connected to a ground voltage source VSS. Consequently, the voltage of the output node N11 starts the transition from "H" to "L". In this case, the control signal C11 is also set to have the logical voltage "H" (for example, 3.3 V) so that the P channel MOS transistor (first switch circuit) Qp31 is turned ON. Consequently, the disconnection between the high voltage source VPP and the output node N11 is started.

At a time t14 when a set time has passed, the control signal C12 is output from the signal delay circuit 16 (the logical voltage is changed from "L" to "H") so that the N channel MOS transistor Qn31 (second switch circuit S12) having great driving ability is turned ON. Consequently, the output node N11 is completely set to have the logical voltage "L".

At a time t15 when the control signal C13 is set to have the logical voltage "L", the control signal C12 is also set to have the logical voltage "L" at almost the same time.

Consequently, the N channel MOS transistors Qn31 and Qn32 (second and third switch circuits S12 and S13) are turned OFF. At this time, since the control signal C11 is also set to have the logical voltage "L", the P channel MOS transistor Qp31 (first switch circuit S11) is turned ON so that the voltage of the output node N11 is set to the logical voltage "H". Consequently, the P channel MOS transistor Qp162 is turned OFF.

According to the voltage level shifter of the present embodiment, the control signal C13 which is changed to have the ground voltage and the predetermined voltage (for example, 3.3 V) is converted to a signal which is changed to have the ground voltage and the voltage of the high voltage source VPP (for example, 12 V). The converted signal can be output from the output node N11.

(Fifth Embodiment of the Present Invention)

Figure 18:
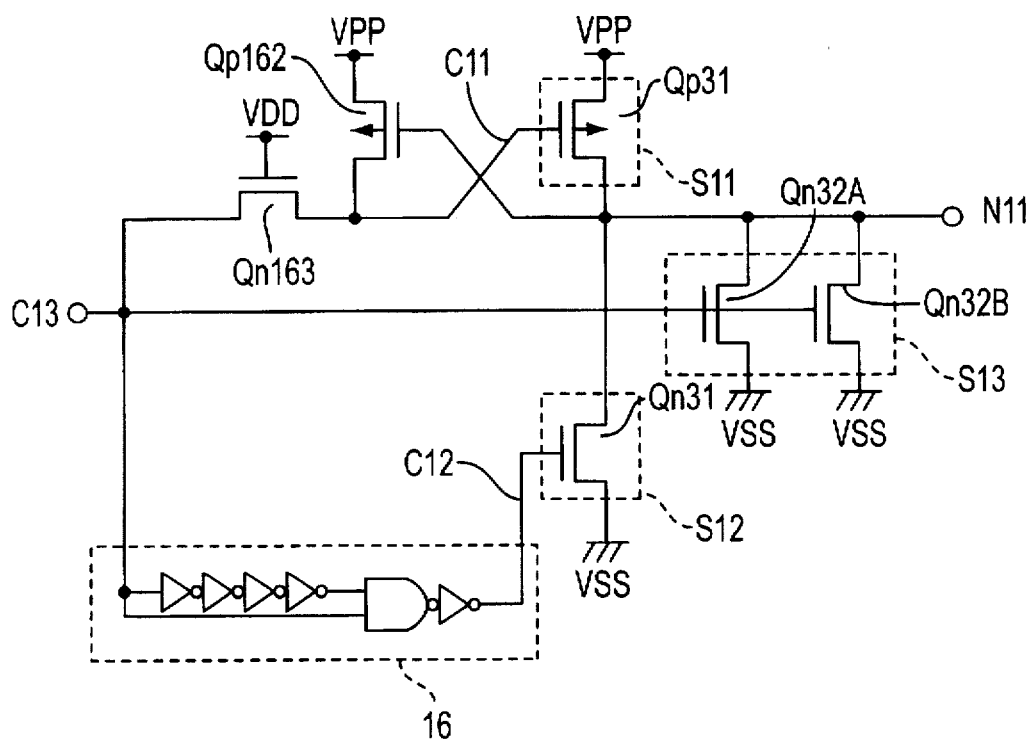
FIG. 18 is a diagram showing a voltage level shifter according to a fifth embodiment of the present invention.

FIG. 18 shows a voltage level shifter according to a fifth embodiment of the present invention. In FIG. 18, the voltage level shifter is formed by using the structure of the second specific high voltage withstanding circuit according to the first embodiment shown in FIG. 5.

More specifically, the structure of the third switch circuit S13 of the voltage level shifter according to the fourth embodiment shown in FIG. 16 is changed so that the third switch circuit S13 is formed by N channel MOS transistors Qn32A and Qn32B which are connected in parallel, the gate lengths L of the N channel MOS transistors Qn32A and Qn32B are increased and the gate widths W thereof are decreased to raise the ON-state withstanding voltage of the third switch circuit S13.

(Sixth Embodiment of the Present Invention)

Figure 19:
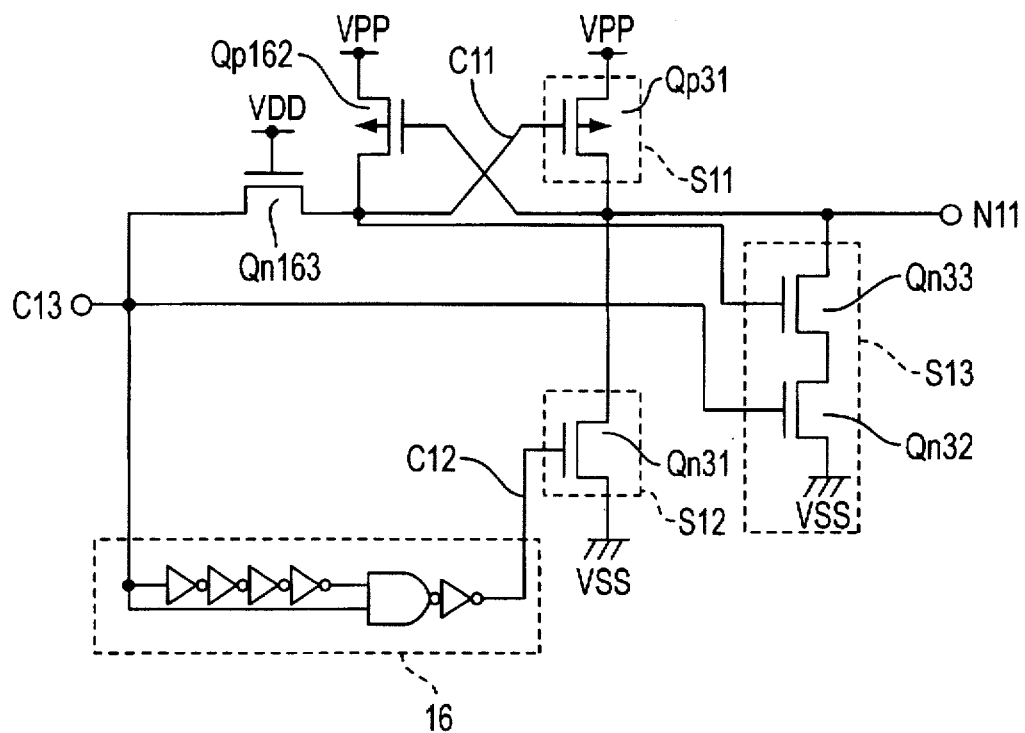
FIG. 19 is a diagram showing a voltage level shifter according to a sixth embodiment of the present invention.

FIG. 19 shows a voltage level shifter according to a sixth embodiment of the present invention. FIG. 19 differs from FIG. 16 showing the fourth embodiment in that an N channel MOS transistor Qn33 is provided as a third switch circuit S13 in series in addition to the N channel MOS transistor Qn32 and a control signal C11, that is, a voltage which is lower than that of a control signal 13 by the threshold voltage of an N channel MOS transistor Qn163 is input to the gate of the N channel MOS transistor Qn33.

According to the present embodiment, the voltage of the control signal C11 is lower than that of the control signal 13 by the threshold voltage of the N channel MOS transistor Qn163. Consequently, it is hard for a current to flow to the N channel MOS transistor Qn33. As a result, the third switch circuit S13 is hard to break down.

(Seventh Embodiment of the Present Invention)

Figure 20:
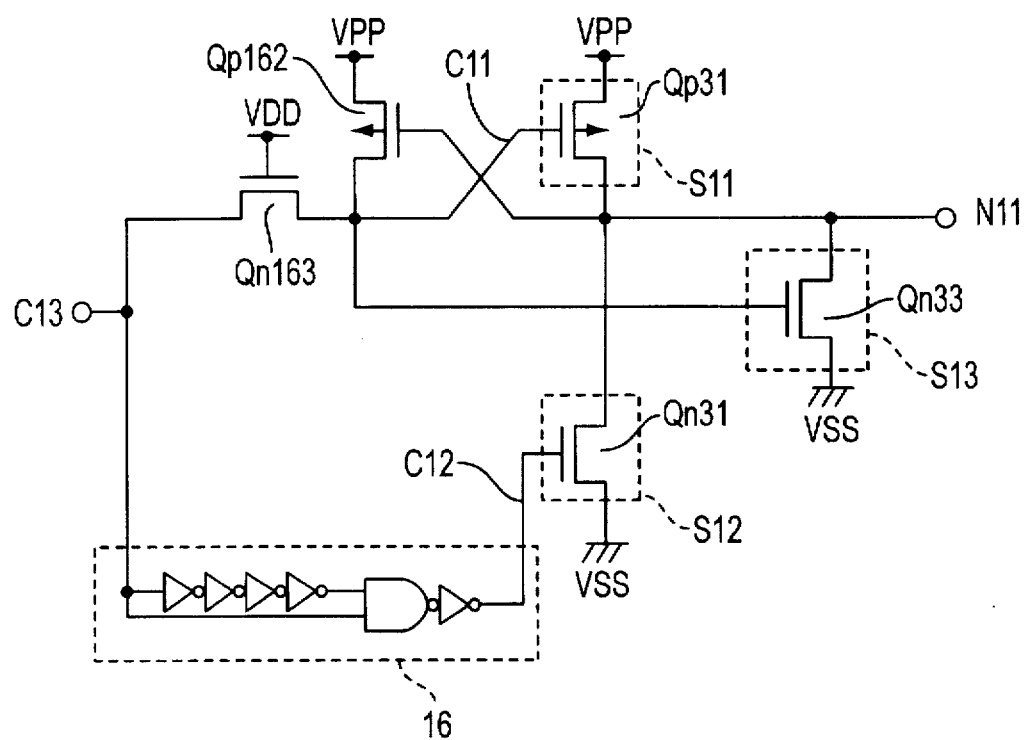
FIG. 20 is a diagram showing a voltage level shifter according to a seventh embodiment of the present invention.
Figure 21:
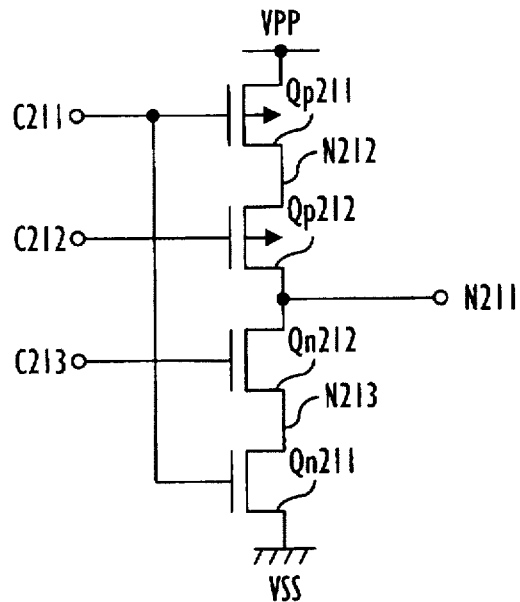
FIG. 21 is a diagram showing a specific high voltage withstanding circuit according to the prior art.
Figure 22:
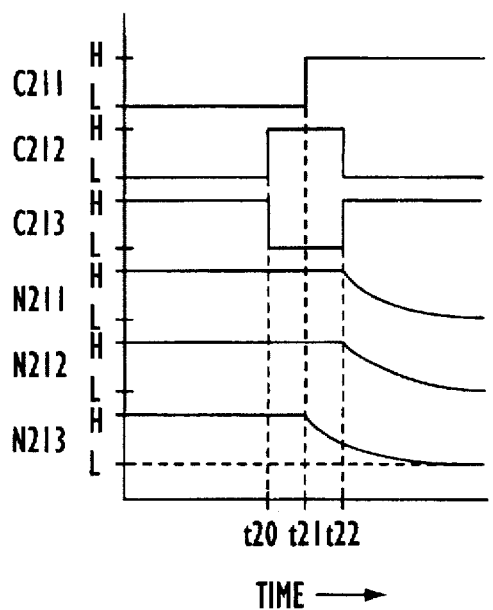
FIG. 22 is a timing chart showing the operation of the specific high voltage withstanding circuit according to the prior art.

FIG. 20 shows a voltage level shifter according to a seventh embodiment of the present invention. FIG. 20 differs from FIG. 19 showing the sixth embodiment in that the N channel MOS transistor Qn32 is not provided but only an N channel MOS transistor Qn33 which is controlled by a control signal C11 is provided on a third switch circuit S13.

According to the present embodiment, the N channel MOS transistor Qn32 is omitted so that a circuit structure can be simplified. In addition, the third switch circuit S13 is hard to break down.

Although the present invention has fully been described by way of example with reference to the accompanying drawings, it is to be understood that various changes and modifications will be apparent to those skilled in the art. Therefore, unless otherwise such changes and modifications depart from the scope of the invention, they should be construed as being included therein.

We claim:

1. A high voltage withstanding circuit which operates by using a high voltage source, comprising:

a first switch circuit connected between said high voltage source and a specified node; and second and third switch circuits connected between said specified node and a ground voltage source;

wherein said third switch circuit has a higher withstanding voltage in the ON state than that of said second switch circuit; and wherein when said specified node has a high voltage of said high voltage source, the charges stored in said specified node are discharged through said third switch circuit at the beginning of the discharge of the charges.

2. The high voltage withstanding circuit of claim 1, wherein a resistor is provided between said specified node and said third switch circuit.

3. The high voltage withstanding circuit of claim 1, wherein when said specified node has the high voltage of said high voltage source, said third switch circuit is turned ON so that the charges stored in said specified node are discharged through said third switch circuit at the beginning of the discharge of the charges; and wherein said second switch circuit is turned ON when a preset period passes after said third switch circuit is turned ON, and the charges of said specified node are discharged through said second and third switch circuits.

4. The high voltage withstanding circuit of claim 3, wherein said second switch circuit has greater driving ability than that of said third switch circuit.

5. The high voltage withstanding circuit of claim 1, wherein said third switch circuit is formed by an N channel MOS transistor.

6. The high voltage withstanding circuit of claim 1, wherein said third switch circuit is formed by a P channel MOS transistor.

7. The high voltage withstanding circuit of claim 1, wherein said third switch circuit is formed by a MOS transistor.

8. The high voltage withstanding circuit of claim 1, wherein said third switch circuit is formed by an N channel MOS transistor, said N channel MOS transistor being turned ON when a voltage which is lower than the voltage of said high voltage source is applied to the gate thereof; and wherein it is hard for a current to flow through said N channel MOS transistor during ON operation.

9. The high voltage withstanding circuit of claim 1, wherein said third switch circuit comprises:

first and second N channel MOS transistors provided between a specified node and a ground voltage source and connected in series; and a third N channel MOS transistor having a gate connected to the high voltage source, wherein said second N channel MOS transistor is turned ON on receipt of a control signal, and said first N channel MOS transistor is turned ON on receipt of said control signal through said third N channel MOS transistor.

10. The high voltage withstanding circuit of claim 1, wherein said third switch circuit is formed by a plurality of N channel MOS transistors connected in parallel with great gate lengths.

11. The high voltage withstanding circuit of claim 1, wherein said third switch circuit in formed by a plurality of P channel MOS transistors connected in parallel with great gate lengths.

12. The high voltage withstanding circuit of claim 1, wherein said third switch circuit is formed by a plurality of N channel MOS transistors connected in parallel with small gate widths.

13. The high voltage withstanding circuit of claim 1, wherein said third switch circuit is formed by a plurality of P channel MOS transistors connected in parallel with small gate widths.

14. A voltage level shifter which inputs an external signal that is changed to have a predetermined voltage and a ground voltage, and outputs a signal having the ground voltage when said input signal has said predetermined voltage and outputs the signal that is changed to have a higher voltage than said predetermined voltage when said input signal has the ground voltage, comprising:

a high voltage source for generating said higher voltage;

a first switch circuit connected between said high voltage source and an output node; and second and third switch circuits connected between said output node and a ground voltage source;

wherein said third switch circuit has a higher withstanding voltage in an ON state than that of said second switch circuit;

wherein said first switch circuit is turned ON to connect said high voltage source to said output node when said external signal has said ground voltage; and wherein said third switch circuit is turned ON when said external signal has the transition from said ground voltage to said predetermined voltage, and said second switch circuit is turned ON to connect said output node to said ground voltage source when a set period passes since said third switch circuit is turned ON.

15. The voltage level shifter of claim 14, further comprising a signal delay circuit for delaying the input signal by a set time;

wherein a signal which is delayed by said signal delay circuit is input to a second switch circuit to turn ON said second switch circuit when said input signal is changed to have a predetermined voltage.

16. The voltage level shifter of claim 14, wherein said second switch circuit has greater driving ability than that of said third switch circuit.

17. The voltage level shifter of claim 14, wherein said third switch circuit is formed by an N channel MOS transistor.

18. The voltage level shifter of claim 15, wherein said external signal is input to the gate of the N channel MOS transistor forming said third switch circuit.

19. The voltage level shifter of claim 17, further comprising another N channel MOS transistor having a gate connected to a voltage source for generating said predetermined voltage;

wherein said third switch circuit is formed by two N channel MOS transistors which are connected in series; and wherein said external signal is directly input to the gate of one of the N channel MOS transistors forming said third switch circuit, and said external signal is input to the gate of the other N channel MOS transistor through said another N channel MOS transistor.

20. The voltage level shifter of claim 15, further comprising another N channel MOS transistor having a gate connected to a voltage source for generating said predetermined voltage;

wherein said third switch circuit is formed by an N channel MOS transistor; and wherein said external signal is input to the gate of the N channel MOS transistor forming said third switch circuit through said another N channel MOS transistor.

21. The voltage level shifter of claim 14, wherein said third switch circuit is formed by a plurality of MOS transistors having a great gate length which are connected in parallel.

22. The voltage level shifter of claim 14, wherein said third switch circuit is formed by a plurality of MOS transistors having a small gate width which are connected in parallel.

* * * * *

UNITED STATES PATENT AND TRADEMARK OFFICE
CERTIFICATE OF CORRECTION

PATENT NO. : 5,760,606
DATED : June 2, 1998
INVENTOR(S) : Hiroshige Hirano, et. al.

It is certified that error appears in the above-identified patent and that said Letters Patent is hereby corrected as shown below:

Col. 12,

Line 46, change "15" to --17--; and

Line 62, change "15" to --17--.

Signed and Sealed this

Twenty-fourth Day of August, 1999

Attest:

Q. TODD DICKINSON

Attesting Officer

Acting Commissioner of Patents and Trademarks